(12) United States Patent
Choi

(10) Patent No.: US 10,074,673 B2
(45) Date of Patent: Sep. 11, 2018

(54) FLEXIBLE DISPLAY APPARATUS AND METHOD OF MANUFACTURING THE SAME

(71) Applicant: SAMSUNG DISPLAY CO., LTD., Yongin-si, Gyeonggi-do (KR)

(72) Inventor: Kwanghyuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/342,757

(22) Filed: Nov. 3, 2016

(65) Prior Publication Data

US 2017/0148826 A1   May 25, 2017

(30) Foreign Application Priority Data

Nov. 23, 2015 (KR) .................. 10-2015-0163976

(51) Int. Cl.
| | |
|---|---|
| *H01L 27/12* | (2006.01) |
| *H01L 27/32* | (2006.01) |
| *H01L 51/00* | (2006.01) |
| *G02F 1/1333* | (2006.01) |

(Continued)

(52) U.S. Cl.
CPC .... *H01L 27/1244* (2013.01); *G02F 1/133305* (2013.01); *H01L 27/1218* (2013.01); *H01L 27/1259* (2013.01); *H01L 27/3276* (2013.01); *H01L 51/0097* (2013.01); *G02F 1/13452* (2013.01); *G02F 2201/42* (2013.01); *H01L 51/5246* (2013.01); *H01L 2251/5338* (2013.01); *Y02E 10/549* (2013.01)

(58) Field of Classification Search
CPC ............. H01L 27/1244; H01L 27/1259; H01L 27/3276; H01L 51/0097; H01L 27/1218; H01L 51/5246; H01L 2251/5338; G02F 1/133305; G02F 2201/42; G02F 1/13452
USPC ........................................................ 257/774
See application file for complete search history.

(56) References Cited

U.S. PATENT DOCUMENTS

| | | | | |
|---|---|---|---|---|
| 8,836,094 | B1 * | 9/2014 | Lin | ......................... H01L 23/13 257/676 |
| 2004/0238936 | A1 * | 12/2004 | Rumer | ................. H01L 23/481 257/688 |

(Continued)

FOREIGN PATENT DOCUMENTS

| | | |
|---|---|---|
| KR | 10-2011-0106539 | 9/2011 |
| KR | 10-2014-0064156 | 5/2014 |

(Continued)

*Primary Examiner* — Fernando L Toledo
*Assistant Examiner* — Adam S Bowen
(74) *Attorney, Agent, or Firm* — Lewis Roca Rothgerber Christie LLP

(57) ABSTRACT

The present disclosure provides, for realization of a flexible display apparatus capable of implementing a slim bezel and a method of manufacturing the same, a flexible display apparatus including: a flexible substrate including a first area having a first hole, a second area having a second hole and arranged corresponding to the first area, and a third area between the first area and the second area; a first wiring covering the first hole and arranged in the first area; and a second wiring covering the second hole, arranged in the second area, and electrically connected to the first wiring via the first hole and the second hole.

18 Claims, 6 Drawing Sheets

(51) Int. Cl.
　　　*G02F 1/1345*　　　(2006.01)
　　　*H01L 51/52*　　　(2006.01)

(56) References Cited

U.S. PATENT DOCUMENTS

| | | | |
|---|---|---|---|
| 2012/0306075 A1* | 12/2012 | Kim | H01L 23/49811 |
| | | | 257/738 |
| 2014/0183473 A1 | 7/2014 | Lee et al. | |
| 2014/0217382 A1 | 8/2014 | Kwon et al. | |
| 2014/0217397 A1 | 8/2014 | Kwak et al. | |
| 2015/0036300 A1 | 2/2015 | Park et al. | |
| 2015/0137102 A1 | 5/2015 | Yang | |

FOREIGN PATENT DOCUMENTS

| | | |
|---|---|---|
| KR | 10-2014-0085956 | 7/2014 |
| KR | 10-2014-0099139 | 8/2014 |
| KR | 10-2014-0099174 | 8/2014 |
| KR | 10-2014-0108826 | 9/2014 |
| KR | 10-2015-0014713 | 2/2015 |
| KR | 10-2015-0059048 | 5/2015 |

\* cited by examiner

FLEXIBLE DISPLAY APPARATUS AND METHOD OF MANUFACTURING THE SAME

CROSS-REFERENCE TO RELATED APPLICATION

This application claims priority to and the benefit of Korean Patent Application No. 10-2015-0163976, filed on Nov. 23, 2015 in the Korean Intellectual Property Office, the entire content of which is incorporated herein by reference.

BACKGROUND

1. Field

Aspects of embodiments of the present disclosure relate to a flexible display apparatus and a method of manufacturing the same.

2. Description of the Related Art

An organic light emitting display apparatus has advantages such as a wide viewing angle, an excellent contrast, and a fast response speed, and, thus, has received attention as a next-generation display element among display apparatuses.

In general, the organic light emitting display apparatus has a thin film transistor and an organic light emitting device arranged on a substrate, and operates as the organic light emitting device emits light by itself. The organic light emitting display apparatus is used as a display unit of small products, such as a mobile phone, and also as a display unit of large products, such as a TV.

Recently, the attention on a flexible display apparatus among organic light emitting display apparatuses has especially increased, and, accordingly, research into the flexible display apparatus has actively been performed. A flexible substrate using a material such as a synthetic resin, rather than a conventional glass substrate, has been utilized to realize the flexible display apparatus.

A problem remains in a conventional flexible display apparatus and a method of manufacturing the same that a maximum display area cannot be implemented due to an area occupied by a bezel around the periphery of the display area.

SUMMARY

According to aspects of one or more embodiments of the present disclosure, a flexible display apparatus implements a slim bezel, and a method of manufacturing the same is provided, while solving various problems including those described above. However, the present disclosure is not limited to solving the above-described problems.

According to one or more embodiments, a flexible display apparatus includes: a flexible substrate including a first area having a first hole, a second area having a second hole and arranged so as to correspond to the first area, and a third area between the first area and the second area; a first wiring covering the first hole and arranged in the first area; and a second wiring covering the second hole, arranged in the second area, and electrically connected to the first wiring via the first hole and the second hole.

Additional aspects and features of the present disclosure will be set forth in part in the description which follows and, in part, will be apparent from the description, or may be learned by practice of the presented embodiments.

According to an embodiment, the first hole and the second hole may penetrate the flexible substrate.

According to an embodiment, at least a portion of the first wiring may be embedded in the first hole.

According to an embodiment, at least a portion of the second wiring may be embedded in the second hole.

According to an embodiment, the third area may be an area bent to have a radius of curvature.

According to an embodiment, the flexible display apparatus may further include an inorganic layer arranged on the flexible substrate excluding the third area.

According to an embodiment, the flexible display apparatus may further include an organic layer arranged on the flexible substrate and only the organic layer may be arranged in the third area.

According to an embodiment, the first wiring and the second wiring may not be arranged in the third area.

According to an embodiment, the flexible display apparatus may further include a display unit arranged in the first area, and a driver arranged in the second area.

According to an embodiment, the flexible display apparatus may further include a conductive layer electrically connecting the first wiring and the second wiring between the first area and the second area.

According to an embodiment, the third area may include a 3-1 surface arranged toward an outside of the flexible substrate and a 3-2 surface arranged toward an inside of the flexible substrate, and the flexible display apparatus may further include a metal layer arranged on the 3-2 surface.

According to an embodiment, the metal layer may be in contact with the first hole and electrically connected to the first wiring, and may be in contact with the second hole and electrically connected to the second wiring.

According to an embodiment, the first area may include a 1-1 surface having the first wiring arranged thereon and a 1-2 surface arranged on a side of the first area opposite the 1-1 surface, the second area may include a 2-1 surface having the second wiring arranged thereon and a 2-2 surface arranged on a side of the second area opposite the 2-1 surface, and the 1-2 surface and the 2-2 surface may face each other.

According to an embodiment, a portion of the 1-2 surface and the 2-2 surface may be in surface-contact with each other.

According to another aspect of the present disclosure, a method of manufacturing a flexible display apparatus may include: preparing a flexible substrate including a first area, a second area, and a third area between the first area and the second area; forming a first hole penetrating the first area; forming a second hole penetrating the second area; forming a first wiring to cover the first hole in the first area; forming a second wiring to cover the second hole in the second area; and bending the third area, wherein the first wiring and the second wiring are electrically connected via the first hole and the second hole.

According to an embodiment, the forming the first wiring may include embedding at least a portion of the first wiring in the first hole, and the forming the second wiring may include embedding at least a portion of the second wiring in the second hole.

According to an embodiment, the method may further include forming an inorganic layer on the flexible substrate, and the inorganic layer may be formed on the flexible substrate excluding the third area.

According to an embodiment, the first wiring and the second wiring may not be formed on the flexible substrate in the third area.

According to an embodiment, the method may further include forming a conductive layer electrically connecting the first wiring and the second wiring between the first area and the second area.

According to an embodiment, the first area may be formed to include a 1-1 surface having the first wiring arranged thereon and a 1-2 surface arranged on a side of the first area opposite the 1-1 surface, the second area may be formed to include a 2-1 surface having the second wiring arranged thereon and a 2-2 surface arranged on a side of the second area opposite the 2-1 surface, and the 1-2 surface and the 2-2 surface may be formed to face each other.

The above aspects and features may be embodied by embodiments described in further detail herein and may be implemented, for example, by using a system, a method, a computer program, or a combination thereof.

BRIEF DESCRIPTION OF THE DRAWINGS

The above aspects and/or other aspects will become apparent and more readily appreciated from the following description of some embodiments, taken in conjunction with the accompanying drawings in which.

DETAILED DESCRIPTION

Figure 1:
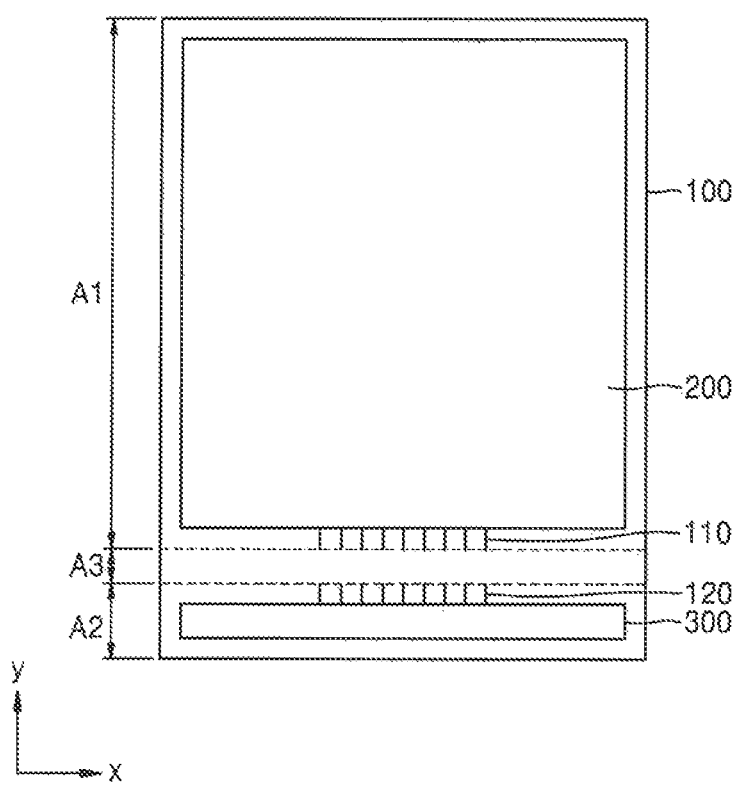
FIG. 1 is a plan view of a flexible display apparatus according to an embodiment.

Reference will now be made in further detail to some embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the present description.

The attached drawings for illustrating some embodiments are referred to in order to gain a sufficient understanding of the present disclosure, merits thereof, and objectives accomplished by the implementation of the present disclosure.

Hereinafter, the present disclosure will be described in further detail by explaining some embodiments with reference to the attached drawings. Like reference numerals in the drawings denote like elements.

While such terms as "first," "second," etc., may be used to describe various components, such components are not to be limited by the above terms. The above terms are used only to distinguish one component from another. An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

Sizes of components and/or layers in the drawings may be exaggerated for convenience of explanation. In other words, since sizes and thicknesses of components and/or layers in the drawings may be arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two or more consecutively described processes may be performed substantially at the same time or performed in an order different from the described order.

Figure 2:
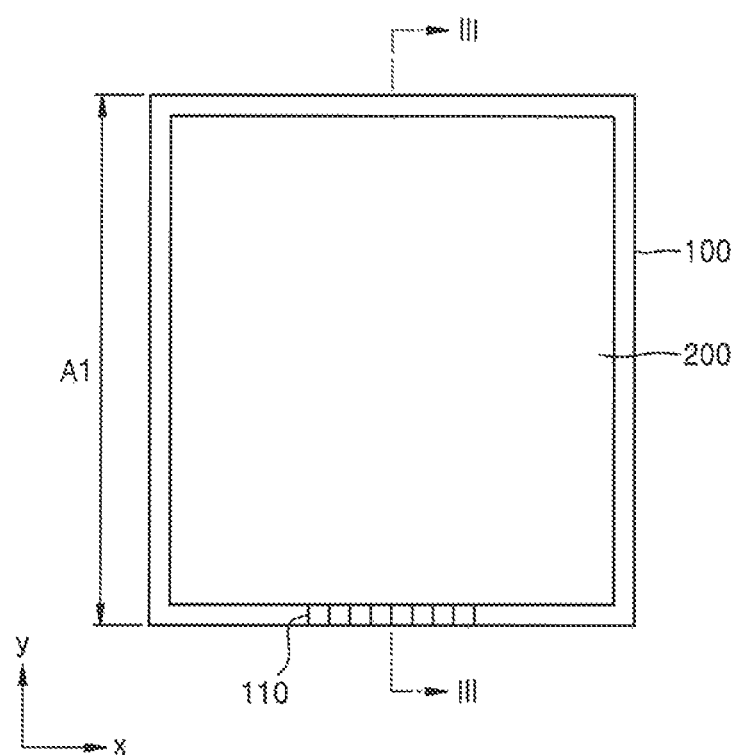
FIG. 2 is a plan view of a flexible display apparatus according to an embodiment.

FIG. 1 is a plan view of a flexible display apparatus according to an embodiment; FIG. 2 is a plan view of a flexible display apparatus according to an embodiment; and FIG. 3 is a cross-sectional view of the flexible display apparatus of FIG. 2, taken along the line III-III.

Figure 3:
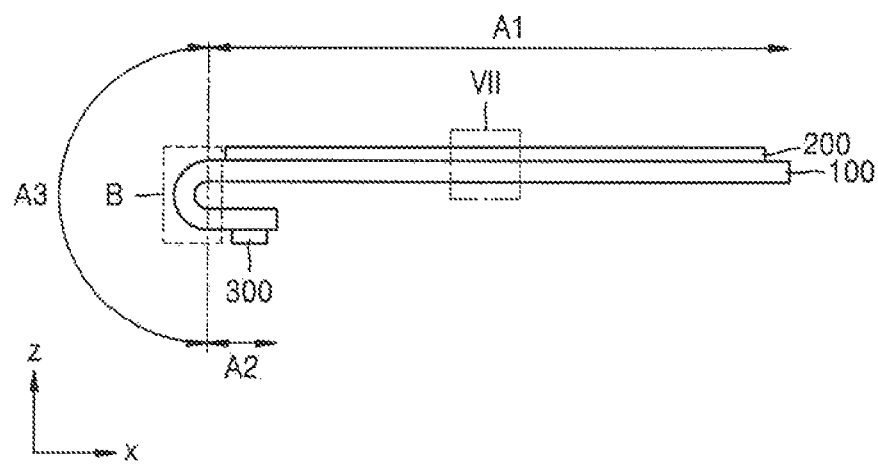
FIG. 3 is a cross-sectional view of the flexible display apparatus of FIG. 2, taken along the line III-III.

Referring to FIGS. 1 through 3, a flexible display apparatus according to an embodiment may include: a flexible substrate 100 including a first area A1, a second area A2, and a third area A3 between the first area A1 and the second area A2; a first wiring 110 and a display unit 200 arranged in the first area A1; and a second wiring 120 and a driver 300 arranged in the second area A2.

The flexible substrate 100 may have a characteristic of flexibility and may include a metal material or a plastic material, such as polyethersulphone (PES), polyacrylate (PA), polyetherimide (PEI), polyethylene napthalate (PEN), polyethylene terephthalate (PET), polyphenylene sulfide (PPS), polyarylate (PAR), polyimide (PI), polycarbonate (PC), cellulose triacetate (TAC), cellulose acetate propionate (CAP), and poly(arylene ether sulfone), or any of other various materials.

According to an embodiment, the flexible substrate 100 may include the first area A1 with the display unit 200 arranged thereon, the second area A2 with the driver 300 arranged thereon, and the third area A3 between the first area A1 and the second area A2. As illustrated in FIG. 1, the first area A1 and the second area A2 may be separate from each other by a certain gap, and the area where the first area A1 and the second area A2 are separate from each other may denote the third area A3. The first area A1 and the second area A2 may be flat areas and the third area A3 may be a bent area. In FIG. 1, the flexible display apparatus before the third area A3 is bent is illustrated. In the flexible display apparatus of FIG. 1, the third area A3 may be bent based on an x-axis and a configuration illustrated in FIG. 2 may be finally realized.

The display unit 200 may be arranged in the first area A1 of the flexible substrate 100. The display unit 200 may include a plurality of pixels and a plurality of thin film transistors (TFTs) electrically and respectively connected to the plurality of pixels. The display unit 200 may be an organic light emitting display unit or a liquid crystal display unit. A structure of the display unit 200 including the pixels will be described in further detail in connection with FIG. 7 below.

The first wiring 110 may be arranged in the first area A1 of the flexible substrate 100. The first wiring 110 may supply an electric signal to the display unit 200 and may be formed via extensions of a scan wiring, a data wiring, a power supply wiring, etc. arranged in the display unit 200. The first wiring 110 may extend in one direction from a side of the display unit 200 adjacent to the third area A3; however, the first wiring 110 is not extended into the third area A3. According to an embodiment, the first wiring 110 may not be arranged in the third area A3. As illustrated in FIGS. 1 and 2, a plurality of first wirings 110 may be arranged.

The driver 300 may be arranged in the second area A2. The driver 300 may include various elements driving the display unit 200 and may include a pad unit to which a flexible printed circuit board (FPCB), etc. may be attached.

The second wiring 120 may be arranged in the second area A2. The second wiring 120 may transmit an electrical signal from the driver 300 to the display unit 200 and may be electrically connected to the first wiring 110 arranged in the first area A1. The second wiring 120 may extend in a direction from a side of the driver 300 adjacent to the third area A3; however, the second wiring 120 is not extended into the third area A3. In an embodiment, the second wiring 120 may not be arranged in the third area A3. As illustrated in FIGS. 1 and 2, a plurality of second wirings 120 may be arranged.

A side on which the display unit 200 is arranged may be denoted as a front side of the first area A1, and the third area A3 may be denoted as a folded area through which the second area A2 is folded to a back side of the first area A1 based on the third area A3. The flexible display apparatus folded, based on the third area A3, is illustrated in FIG. 2. In other words, when viewed from the front, the driver 300 may not be visible on the flexible substrate 100, and, thus, a size of the display unit 200 may be realized as wide as possible and a slimmer bezel may be implemented.

Figure 4:
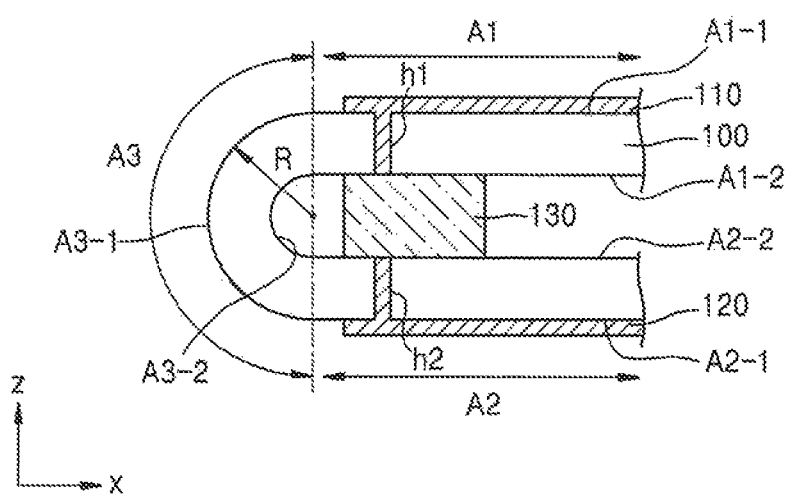
FIG. 4 is an enlarged cross-sectional view of a region "B" in FIG. 3, according to an embodiment.

FIG. 4 is an enlarged cross-sectional view of a region "B" in FIG. 3, according to an embodiment.

Referring to FIG. 4, the flexible substrate 100 may include the first area A1, the second area A2 arranged so as to correspond to the first area A1, and the third area A3, a bent area between the first area A1 and the second area A2. In other words, as illustrated in FIG. 4, the second area A2 may overlap the first area A1 after the second area A2 has been bent based on the third area A3.

The first area A1 may include a first hole h1, and the first wiring 110 may be arranged in the first area A1 to cover the first hole h1. The first hole h1 may be configured to penetrate the flexible substrate 100. Accordingly, that the first wiring 110 covers the first hole h1 may be understood as that at least a portion of the first wiring 110 may be embedded in the first hole h1.

The second area A2 may include a second hole h2, and the second wiring 120 may be arranged in the second area A2 to cover the second hole h2. The second hole h2 may be configured to penetrate the flexible substrate 100. Accordingly, that the second wiring 120 covers the second hole h2 may be understood as that at least a portion of the second wiring 120 may be embedded in the second hole h2. The first hole h1 and the second hole h2 may be respectively formed in locations of the first wiring 110 and the second wiring 120, and, although not illustrated in FIG. 4, pluralities of first and second holes may be formed.

The third area A3 may be the bent area between the first area A1 and the second area A2, and the second area A2 may be configured to be bent to face the back side of the first area A1. The first wiring 110 and the second wiring 120 may not be arranged in the third area A3 to facilitate a bending of the third area A3. In an embodiment, an inorganic layer (not illustrated), which may reduce flexibility during bending or may be damaged via bending, may not be arranged in the third area A3. In other words, the third area A3 may be made up of the flexible substrate 100 only, or an organic layer (not illustrated) only may be arranged in the third area A3 of the flexible substrate 100.

The third area A3 may be bent to have a certain radius of curvature. A radius of curvature R of the third area A3 may be varied, such as depending on a width of the third area A3 and/or a distance between the first area A1 and the second area A2.

The first area A1 may include a 1-1 surface A1-1 with the first wiring 110 arranged thereon and a 1-2 surface A1-2 arranged on an opposite side of the 1-1 surface A1-1. The second area A2 may include a 2-1 surface A2-1 with the second wiring 120 arranged thereon and a 2-2 surface A2-2 arranged on an opposite side of the 2-1 surface A2-1. The 1-2 surface A1-2 in the first area A1 and the 2-2 surface A2-2 in the second area A2 may be configured to face each other due to the bending of the third area A3.

The first wiring 110 may be arranged on the 1-1 surface A1-1 in the first area A1 and may be extended along the first hole h1 in a direction from the 1-1 surface A1-1 to the 1-2 surface A1-2. Accordingly, at least a portion of the first wiring 110 may be exposed toward the 1-2 surface A1-2. The second wiring 120 may be arranged on the 2-1 surface A2-1 in the second area A2 and may be extended along the second hole h2 in a direction from the 2-1 surface A2-1 to the 2-2 surface A2-2. Accordingly, at least a portion of the second wiring 120 may be exposed toward the 2-2 surface A2-2.

A conductive layer 130 may be between the first area A1 and the second area A2. The conductive layer 130 may electrically connect the first wiring 110 and the second wiring 120 to each other. The conductive layer 130 may include a metal material or may be an anisotropic conductive film (AFC).

Figure 5:
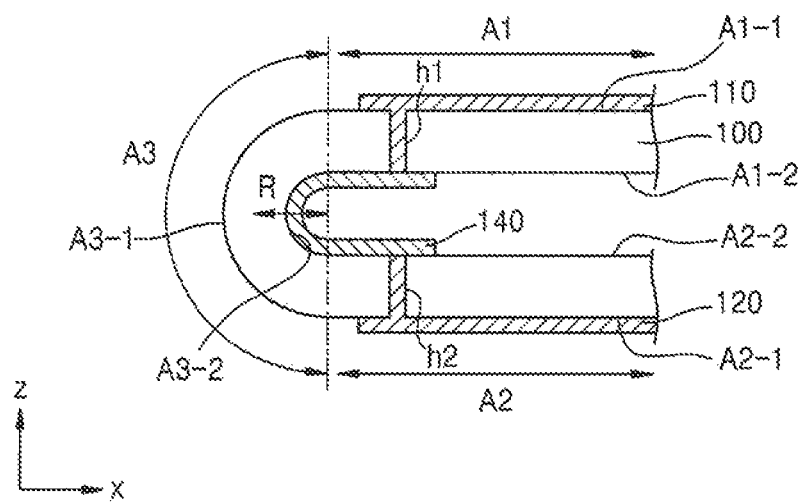
FIG. 5 is an enlarged cross-sectional view of the region "B" in FIG. 3, according to another embodiment.

FIG. 5 is an enlarged cross-sectional view of the region "B" in FIG. 3, according to another embodiment.

Referring to FIG. 5, the flexible substrate 100 may include the first area A1, the second area A2 arranged so as to correspond to the first area A1, and the third area A3, a bent area between the first area A1 and the second area A2. In other words, as illustrated in FIG. 5, the second area A2 may overlap the first area A1 after the second area A2 has been bent based on the third area A3.

The first area A1 may include the first hole h1, and the first wiring 110 may be arranged in the first area A1 to cover the first hole h1. The first hole h1 may be configured to penetrate the flexible substrate 100. Accordingly, that the first wiring 110 covers the first hole h1 may be understood as that at least a portion of the first wiring 110 may be embedded in the first hole h1.

The second area A2 may include the second hole h2, and the second wiring 120 may be arranged in the second area A2 to cover the second hole h2. The second hole h2 may be configured to penetrate the flexible substrate 100. Accordingly, that the second wiring 120 covers the second hole h2 may be understood as that at least a portion of the second wiring 120 may be embedded in the second hole h2. The first hole h1 and the second hole h2 may be respectively formed at locations of the first wiring 110 and the second wiring 120, and, although not illustrated in FIG. 5, pluralities of first and second holes may be formed.

The third area A3 may be the bent area between the first area A1 and the second area A2, and the second area A2 may be configured to be bent to face the back side of the first area A1. The first wiring 110 and the second wiring 120 may not be arranged in the third area A3 to facilitate a bending of the third area A3. In an embodiment, an inorganic layer (not illustrated), which may reduce flexibility during bending or be damaged via bending, may not be arranged in the third area A3. In other words, the third area A3 may be made up of the flexible substrate 100 only, or an organic layer (not illustrated) only may be arranged in the third area A3 of the flexible substrate 100.

The third area A3 may be bent to have a certain radius of curvature. The radius of curvature R may be varied, such as depending on a width of the third area A3 and/or a distance between the first area A1 and the second area A2.

The first area A1 may include the 1-1 surface A1-1 with the first wiring 110 arranged thereon and the 1-2 surface A1-2 arranged on an opposite side of the 1-1 surface A1-1. The second area A2 may include the 2-1 surface A2-1 with the second wiring 120 arranged thereon and the 2-2 surface A2-2 arranged on an opposite side of the 2-1 surface A2-1. The 1-2 surface A1-2 in the first area A1 and the 2-2 surface A2-2 in the second area A2 may be configured to face each other due to the bending of the third area A3.

The first wiring 110 may be arranged on the 1-1 surface A1-1 in the first area A1 and may be extended along the first hole h1 in a direction from the 1-1 surface A1-1 to the 1-2 surface A1-2. Accordingly, at least a portion of the first wiring 110 may be exposed toward the 1-2 surface A1-2. The second wiring 120 may be arranged on the 2-1 surface A2-1 in the second area A2 and may be extended along the second hole h2 in a direction from the 2-1 surface A2-1 to the 2-2 surface A2-2. Accordingly, at least a portion of the second wiring 120 may be exposed toward the 2-2 surface A2-2.

A metal layer 140 may be between the first area A1 and the second area A2. The metal layer 140 may electrically connect the first wiring 110 and the second wiring 120 to each other. The third area A3 may include a 3-1 surface A3-1 facing the outside of the third area A3 and a 3-2 surface A3-2 facing the inside of the third area A3, and the metal layer 140 may be arranged on the 3-2 surface A3-2. The metal layer 140 may be arranged on the 3-2 surface A3-2 and may be extended to locations of the first hole h1 and the second hole h2 in the first area A1 and the second area A2, respectively. In an embodiment, one end of the metal layer 140 may be in contact with the first hole h1 and electrically connected to the first wiring 110, while the other end of the metal layer 140 may be in contact with the second hole h2 and electrically connected to the second wiring 120. Thus, the first wiring 110 and the second wiring 120 may be electrically connected to each other. The metal layer 140 may include a metal material and may be formed via a method such as a deposition method or an inkjet printing method, for example.

Figure 6:
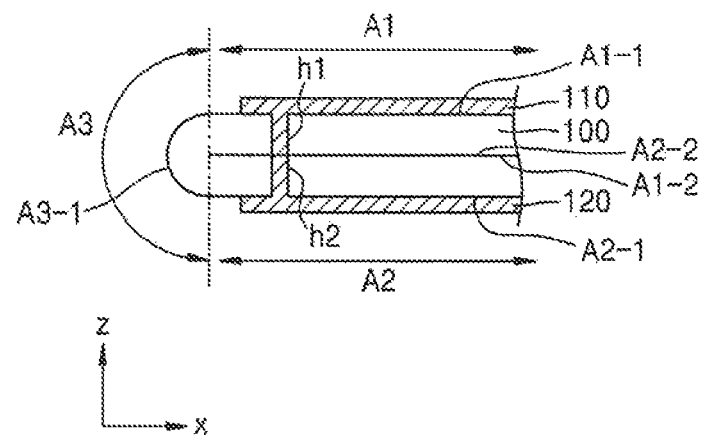
FIG. 6 is an enlarged cross-sectional view of the region "B" in FIG. 3, according to another embodiment.

FIG. 6 is an enlarged cross-sectional view of the region "B" in FIG. 3, according to another embodiment.

Referring to FIG. 6, the flexible substrate 100 may include the first area A1, the second area A2 arranged corresponding to the first area A1, and the third area A3, a bent area between the first area A1 and the second area A2. In other words, as illustrated in FIG. 6, the second area A2 may overlap the first area A1 after the second area A2 has been bent based on the third area A3.

The first area A1 may include the first hole h1, and the first wiring 110 may be arranged in the first area A1 to cover the first hole h1. The first hole h1 may be configured to penetrate the flexible substrate 100. Accordingly, that the first wiring 110 covers the first hole h1 may be understood as that at least a portion of the first wiring 110 may be embedded in the first hole h1.

The second area A2 may include the second hole h2, and the second wiring 120 may be arranged in the second area A2 to cover the second hole h2. The second hole h2 may be configured to penetrate the flexible substrate 100. Accordingly, that the second wiring 120 covers the second hole h2 may be understood as that at least a portion of the second wiring 120 may be embedded in the second hole h2. The first hole h1 and the second hole h2 may be respectively formed in locations of the first wiring 110 and the second wiring 120, and, although not illustrated in FIG. 6, pluralities of first and second holes may be formed.

The third area A3 may be the bent area between the first area A1 and the second area A2, and the second area A2 may be configured to be bent to face the back side of the first area A1. The first wiring 110 and the second wiring 120 may not be arranged in the third area A3 to facilitate a bending of the third area A3. In an embodiment, an inorganic layer (not illustrated), which may reduce flexibility during bending or be damaged via bending, may not be arranged in the third area A3. In other words, the third area A3 may be made up of the flexible substrate 100 only, or an organic layer (not illustrated) only may be arranged in the third area A3 of the flexible substrate 100.

The first area A1 may include the 1-1 surface A1-1 with the first wiring 110 arranged thereon and the 1-2 surface A1-2 arranged on an opposite side of the 1-1 surface A1-1. The second area A2 may include the 2-1 surface A2-1 with the second wiring 120 arranged thereon and the 2-2 surface A2-2 arranged on an opposite side of the 2-1 surface A2-1. The 1-2 surface A1-2 in the first area A1 and the 2-2 surface A2-2 in the second area A2 may be configured to face each other due to the bending of the third area A3.

The first wiring 110 may be arranged on the 1-1 surface A1-1 in the first area A1 and may be extended along the first hole h1 in a direction from the 1-1 surface A1-1 to the 1-2 surface A1-2. Accordingly, at least a portion of the first wiring 110 may be exposed toward the 1-2 surface A1-2. The second wiring 120 may be arranged on the 2-1 surface A2-1 in the second area A2 and may be extended along the second hole h2 in a direction from the 2-1 surface A2-1 to the 2-2 surface A2-2. Accordingly, at least a portion of the second wiring 120 may be exposed toward the 2-2 surface A2-2.

In FIG. 6, at least a portion of the first wiring 110 exposed toward the 1-2 surface A1-2 via the first hole h1 and at least a portion of the second wiring 120 exposed toward the 2-2 surface A2-2 via the second hole h2 may be directly in contact with each other. In an embodiment, the second area A2 may be completely folded to the back side of the first area A1, and the 1-2 surface A1-2 and the 2-2 surface A2-2 may be in surface-contact with each other according to the present embodiment. Then, the first hole h1 and the second hole h2 may be in contact with each other and, thus, the first wiring 110 and the second wiring 120 respectively extended via the first hole h1 and the second hole h2 may be electrically connected to each other.

Figure 7:
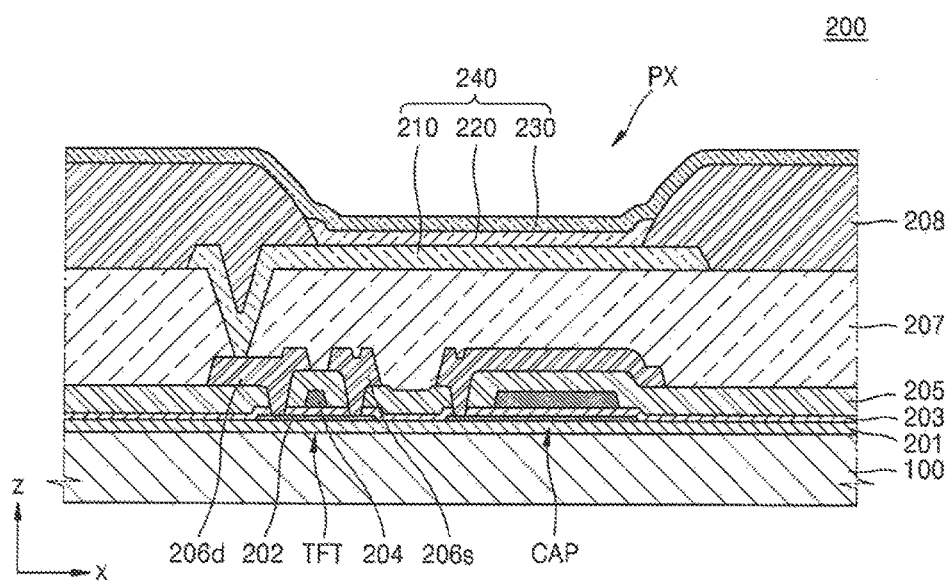
FIG. 7 is an enlarged cross-sectional view of a region "VII" in FIG. 3, according to an embodiment.

FIG. 7 is an enlarged cross-sectional view of a region "VII" in FIG. 3, according to an embodiment.

Referring to FIG. 7, the display unit 200 of the flexible display apparatus may be arranged on the flexible substrate 100. The display unit 200 may be arranged in the first area A1 of the flexible substrate 100 according to the present embodiment. The display unit 200 may include a plurality of pixels PX, thin film transistors (TFT) electrically connected to the plurality of pixels and a capacitor (CAP). FIG. 7 illustrates a cross-section of the pixel PX included in the display unit 200. The display unit 200 may be, for example, a liquid crystal display unit or an organic light emitting display unit. A case in which the display unit 200 is an organic light emitting display unit is described in the present embodiment.

A buffer layer 201, formed of silicon oxide or silicon nitride for a planarization of a surface of the flexible substrate 100 or for preventing or substantially preventing penetration of impurities into a semiconductor layer 202 of the TFT, may be arranged on the flexible substrate 100, and the semiconductor layer 202 may be arranged on the buffer layer 201.

A gate electrode 204 may be arranged on the semiconductor layer 202, and a source electrode 206s and a drain electrode 206d may be electrically connected to each other depending on a signal applied to the gate electrode 204. The gate electrode 204 may include a single layer of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a stack layer of them, considering adhesion to adjacent layers, surface planarization of a laminated layer, processability, etc.

A gate insulating layer 203, formed of silicon oxide and/or silicon nitride to secure insulation between the semiconductor layer 202 and the gate electrode 204, may be arranged between the semiconductor layer 202 and the gate electrode 204.

An interlayer insulating layer 205, formed of a single layer or a stack layer of silicon oxide and/or silicon nitride, may be arranged on the gate electrode 204.

The source electrode 206s and the drain electrode 206d may be arranged on the interlayer insulating layer 205. The source electrode 206s and the drain electrode 206d may be respectively and electrically connected to the semiconductor layer 202 via contact holes formed in the interlayer insulating layer 205 and the gate insulating layer 203. The source electrode 206s and the drain electrode 206d, considering conductivity, may include a single layer of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a stack layer of them.

Although not illustrated, a protecting layer (not illustrated) covering the TFT for protection of the TFT with an above-described structure may be arranged. The protecting layer may be formed of, for example, an inorganic material such as silicon oxide, silicon nitride, and/or silicon oxynitride.

A first insulating layer 207 may be arranged on the flexible substrate 100. In an embodiment, the first insulating layer 207 may be a planarization layer and/or a protecting layer. When an organic light emitting element is arranged on the TFT, the first insulating layer 207 may generally planarize a top surface of the TFT, and protect the TFT and various elements. The first insulating layer 207 may be formed of, for example, an acrylic organic material, benzocyclobutene, etc. As illustrated in FIG. 7, the buffer layer 201, the gate insulating layer 203, the interlayer insulating layer 205 and the first insulating layer 207 may be arranged on a front surface of the flexible substrate 100.

A second insulating layer 208 may be arranged on the TFT. In an embodiment, the second insulating layer 208 may be a pixel definition layer. The second insulating layer 208 may be arranged on the first insulating layer 207 and have an opening. The second insulating layer 208 may define a pixel range on the flexible substrate 100.

The second insulating layer 208 may be equipped with an organic insulating layer. The organic insulating layer may include an acrylic polymer, such as polymethyl methacrylate (PMMA), polystyrene (PS), a polymer derivative having a phenol group, imide polymer, aryl ether polymer, amide-based polymer, fluorine-containing polymer, p-xylene-series polymer, vinyl alcohol-based polymer, and/or a mixture of them.

An organic light emitting element 240 may be arranged on the second insulating layer 208. The organic light emitting element 240 may include a pixel electrode 210, an intermediate layer 220 including an emission layer (EML), and a counter electrode 230.

The pixel electrode 210 may be formed as a (semi) transparent electrode or a reflective electrode. When formed as the (semi) transparent electrode, the pixel electrode 210 may be formed of, for example, ITO, IZO, ZnO, $In_2O_3$, IGO or AZO. When formed as the reflective electrode, the pixel electrode 210 may include a reflective layer formed of Ag, Mg, Al, Pt, Pd, Au, Ni, Nd, Ir, Cr, and/or a mixture of them, and a layer formed of ITO, IZO, ZnO, $In_2O_3$, IGO or AZO. However, the present disclosure is not limited thereto, and any of various materials may be used, and a structure may have various modifications such as a single layer and a stack layer.

The intermediate layer 220 may be respectively arranged on pixel ranges defined by the second insulating layer 208. The intermediate layer 220 may include the EML emitting light due to an electrical signal. In addition to the EML, a hole injection layer (HIL) and a hole transport layer (HTL) arranged between the EML and the pixel electrode 210, an electron transport layer (ETL) and an electron injection layer (EIL) arranged between the EML and the counter electrode 230, etc. may be laminated in a single or stack structure to form the intermediate layer 220. However, the intermediate layer 220 is not limited thereto, and may have any of various structures.

In an embodiment, the counter electrode 230 covering the intermediate layer 220 including the EML, and countering the pixel electrode 210 may be arranged on the entire surface of the flexible substrate 100. The counter electrode 230 may be formed as a (semi) transparent electrode or a reflective electrode.

When formed as the (semi) transparent electrode, the counter electrode 230 may include a layer formed of a metal having a small work function, such as Li, Ca, LiF/Ca, LiF/Al, Al, Ag, Mg, and/or a mixture of them, and a (semi) transparent conductive layer such as ITO, IZO, ZnO and $In_2O_3$. When formed as the reflective electrode, the counter electrode 230 may include a layer formed of Li, Ca, LiF/Ca, LiF/Al, Al, Ag, Mg, and/or a mixture of them. However, structures and materials of the counter electrode 230 are not limited thereto, and various modifications may be possible.

A flexible display apparatus has been described above; however, the present disclosure is not limited thereto. For example, a method of manufacturing the flexible display apparatus is also included in the present disclosure.

Figure 8:
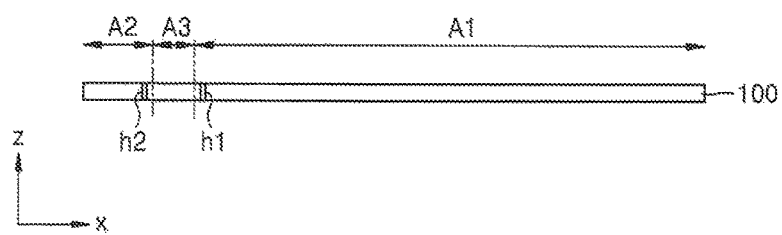
FIG. 8 is a cross-sectional view illustrating a manufacturing process of a flexible display apparatus, according to an embodiment.
Figure 9:
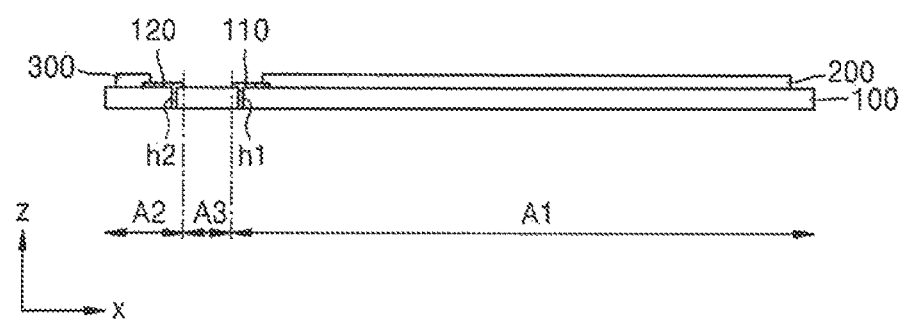
FIG. 9 is a cross-sectional view illustrating a manufacturing process of the flexible display apparatus, according to an embodiment.
Figure 10:
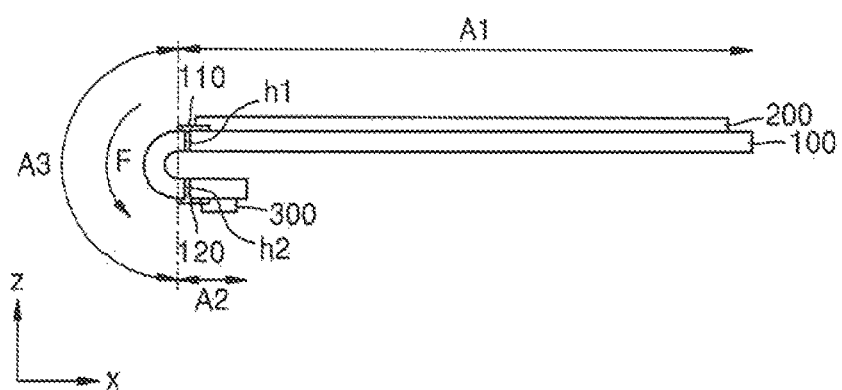
FIG. 10 is a cross-sectional view illustrating a manufacturing process of the flexible display apparatus, according to an embodiment.

FIGS. 8 through 10 are cross-sectional views illustrating a manufacturing process of a flexible display apparatus according to one or more embodiments.

Referring to FIG. 8, the flexible substrate 100 may be prepared which has the first area A1, the second area A2, and the third area A3 between the first area A1 and the second area A2. The flexible substrate 100 may have a characteristic of flexibility and may be formed of various materials including metal materials, plastic materials, such as polyethylene naphthalate (PEN), polyethylene terephthalate (PET), and polyimide (PI), etc.

The first hole h1 may be arranged in the first area A1 of the flexible substrate 100, and the second hole h2 may be arranged in the second area A2. The first hole h1 and the second hole h2 may be respectively formed corresponding to the number of the first wiring 110 and the second wiring 120 described below. The first hole h1 and the second hole h2 may be configured to penetrate the flexible substrate 100. The first hole h1 and the second hole h2 may be formed before various layers on the flexible substrate 100 may be formed or after various layers are laminated on the flexible substrate 100. The first hole h1 and the second hole h2 may be formed via a laser drilling method or via other physical or chemical methods; however, a forming method is not limited thereto.

Referring to FIG. 9, the first wiring 110 may be configured to cover the first hole h1 in the first area A1. In addition, the second wiring 120 may be configured to cover the second hole h2 in the second area A2. The first wiring 110 and the second wiring 120 may be concurrently (e.g., simultaneously) formed via a same or identical process; however, the present disclosure is not limited thereto and other processes may be used. For example, in an embodiment, when the first wiring 110 is formed on the display unit 200, the first wiring 110 may be concurrently (e.g., simultaneously) formed with the source electrode 206s or the drain electrode 206d of the TFT, and the second wiring 120 may be concurrently (e.g., simultaneously) formed with the gate electrode 204 of the TFT. In FIG. 9, the first wiring 110 and the second wiring 120 are illustrated as being directly formed on the flexible substrate 100; however, in one or more embodiments, the first wiring 110 and the second wiring 120 may be formed on the flexible substrate 100 after the buffer layer 201 or other insulating layers are formed.

A portion of the first wiring 110 may be embedded in the first hole h1, and a portion of the second wiring 120 may be embedded in the second hole h2. Accordingly, at least a portion of the first wiring 110 may be exposed to the back surface of the flexible substrate 100 via the first hole h1, and similarly, at least a portion of the second wiring 120 may be exposed to the back surface of the flexible substrate 100 via the second hole h2.

The display unit 200 may be arranged in the first area A1. The display unit 200 may include the plurality of pixels and the plurality of the TFTs. A structure of the display unit 200 is explained in further detail above in connection with FIG. 7, and the description thereof applies here.

The first wiring 110 may be electrically connected to the display unit 200. The first wiring 110 may be a wiring to supply a power to the display unit 200 or a wiring to supply a scan signal or a data signal to each pixel of the display unit 200. Since the first wiring 110 is electrically connected to the second wiring 120, a signal from the driver 300 may be delivered to the display unit 200 via the first wiring 110 and the second wiring 120.

The driver 300 may be arranged in the second area A2. In an embodiment, the driver 300 may be formed together in a process that may form the display unit 200. The second wiring 120 may be electrically connected to the driver 300.

As described above, the display unit 200 and the first wiring 110, and the driver 300 and the second wiring 120 may be respectively formed in the first area A1 and the second area A2, but not in the third area A3. In other words, the first wiring 110 may be formed in the first area A1 only and the second wiring 120 may be formed in the second area A2 only, and neither of them may be formed in the third area A3. In addition, one or more various inorganic layers formed on the flexible substrate 100 may be arranged except in the third area A3 in a process of forming the display unit 200 or the driver 300. Such arrangement is to facilitate a bending of the third area A3, and an inorganic layer, which may reduce flexibility during bending or which may be damaged via bending, may not be arranged in the third area A3. In other words, the third area A3 may be made up of the flexible substrate 100 only, or, in some cases, an organic layer only may be arranged in the third area A3 of the flexible substrate 100.

Referring to FIG. 10, a bending process may be performed, based on the third area A3, such that the second area A2 may be corresponding to at least a portion of the first area A1. As illustrated in FIG. 10, the substrate 100 may be bent along a counterclockwise direction such that the second area A2 may be arranged at the back surface of the first area A1.

The first area A1 may include the 1-1 surface A1-1 with the first wiring 110 and the display unit 200 arranged thereon and the 1-2 surface A1-2 arranged on the opposite side of the 1-1 surface A1-1. The second area A2 may include the 2-1 surface A2-1 with the second wiring 120 and the driver 300 arranged thereon and the 2-2 surface A2-2 arranged on the opposite side of the 2-1 surface A2-1. Referring to FIG. 10, at least a portion of the first area A1 and the second area A2 may be overlapped each other, based on the third area A3, and the 1-2 surface A1-2 and the 2-2 surface A2-2 may be configured to face each other. Thus, the first hole h1 and the second hole h2 may be arranged to correspond to each other.

Then, the first wiring 110 and the second wiring 120 may be electrically connected to each other via the first hole h1 and the second hole h2. Some methods of electrically connecting the first wiring 110 and the second wiring 120 are illustrated in embodiments described above in connection with FIGS. 4 through 6.

Referring to FIG. 4, after at least a portion of the first area A1 may be arranged corresponding to the second area A2 via bending the third area A3, the conductive layer 130 may be between the first area A1 and the second area A2, and the first wiring 110 and the second wiring 120 may be electrically connected to each other. The conductive layer 130 may include a metal material or may be the AFC.

Referring to FIG. 5, the metal layer 140 may be between the first area A1 and the second area A2. The metal layer 140 may electrically connect the first wiring 110 and the second wiring 120 to each other. Various elements such as the first wiring 110, the second wiring 120, and the display unit 200 may be formed on the front surface of the flexible substrate 100 and a protecting film may be attached onto various elements. Then, the metal layer 140 may be formed on the back surface of the flexible substrate 100. The metal layer 140 may be formed in the third area A3 and extended to locations of the first hole h1 and the second hole h2 in the first area A1 and the second area A2, respectively. In an embodiment, one end of the metal layer 140 may be in contact with the first hole h1 and electrically connected to the first wiring 110, while the other end of the metal layer 140 may be in contact with the second hole h2 and electrically connected to the second wiring 120. Thus, the first wiring 110 and the second wiring 120 may be electrically connected to each other. The metal layer 140 may include a metal material, and may be formed via methods such as a deposition method and/or an inkjet printing method.

Referring to FIG. 6, when the third area A3 is bent, at least a portion of the first area A1 may be in surface-contact with the second area A2, such as in a completely folded state. In this case, the first wiring 110 and the second wiring 120 may be electrically connected to each other without a separate connecting member via a direct contact between the first hole h1 and the second hole h2.

It should be understood that while some exemplary embodiments have been described herein, they should be considered in a descriptive sense and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A flexible display apparatus comprising:
   a flexible substrate comprising a first area having a first hole, a second area having a second hole and corresponding to the first area, and a third area between the first area and the second area, wherein the third area is an area bent to have a radius of curvature;
   a first wiring covering the first hole and arranged in the first area; and
   a second wiring covering the second hole, arranged in the second area, and electrically connected to the first wiring via the first hole and the second hole,
   wherein the first hole and the second hole penetrate completely through the flexible substrate, and
   wherein the first wiring and the second wiring are each in direct contact with a conductive layer therebetween or in direct contact with each other.

2. The flexible display apparatus of claim 1, wherein at least a portion of the first wiring is embedded in the first hole.

3. The flexible display apparatus of claim 1, wherein at least a portion of the second wiring is embedded in the second hole.

4. The flexible display apparatus of claim 1, further comprising an inorganic layer arranged on the flexible substrate excluding the third area.

5. The flexible display apparatus of claim 1, further comprising an organic layer on the flexible substrate, wherein only the organic layer is arranged in the third area.

6. The flexible display apparatus of claim 1, wherein the first wiring and the second wiring are not arranged in the third area.

7. The flexible display apparatus of claim 1, further comprising a display unit arranged in the first area, and a driver arranged in the second area.

8. The flexible display apparatus of claim 1, wherein the conductive layer electrically connecting the first wiring and the second wiring is arranged between the first area and the second area.

9. The flexible display apparatus of claim 1, wherein the third area comprises a 3-1 surface facing an outside of the flexible substrate and a 3-2 surface facing an inside of the flexible substrate, and the conductive layer comprises a metal layer arranged on the 3-2 surface.

10. The flexible display apparatus of claim 9, wherein the metal layer is in contact with the first hole and electrically connected to the first wiring, and is in contact with the second hole and electrically connected to the second wiring.

11. The flexible display apparatus of claim 1, wherein the first area comprises a 1-1 surface having the first wiring arranged thereon and a 1-2 surface arranged on a side of the first area opposite the 1-1 surface, the second area comprises a 2-1 surface having the second wiring arranged thereon and a 2-2 surface arranged on a side of the second area opposite the 2-1 surface, and the 1-2 surface and the 2-2 surface face each other.

12. The flexible display apparatus of claim 11, wherein at least a portion of the 1-2 surface and the 2-2 surface are in surface-contact with each other.

13. A method of manufacturing a flexible display apparatus, the method comprising:
    preparing a flexible substrate including a first area, a second area, and a third area between the first area and the second area;
    forming a first hole penetrating completely through the flexible substrate in the first area;
    forming a second hole penetrating completely through the flexible substrate in the second area;
    forming a first wiring to cover the first hole on the first area;
    forming a second wiring to cover the second hole on the second area; and
    bending the third area, wherein the first wiring and the second wiring are electrically connected with each other via the first hole and the second hole, and wherein the first wiring and the second wiring are each in direct contact with a conductive layer therebetween or in direct contact with each other.

14. The method of claim 13, wherein the forming the first wiring comprises embedding at least a portion of the first wiring in the first hole, and the forming the second wiring comprises embedding at least a portion of the second wiring in the second hole.

15. The method of claim 13, further comprising forming an inorganic layer on the flexible substrate, wherein the inorganic layer is formed on the flexible substrate excluding the third area.

16. The method of claim 13, wherein the first wiring and the second wiring are not formed on the flexible substrate in the third area.

17. The method of claim 13, further comprising forming the conductive layer electrically connecting the first wiring and the second wiring between the first area and the second area.

18. The method of claim 13, wherein the first area comprises a 1-1 surface having the first wiring arranged thereon and a 1-2 surface arranged on a side of the first area opposite the 1-1 surface, the second area comprises a 2-1 surface having the second wiring arranged thereon and a 2-2 surface arranged on a side of the second area opposite the 2-1 surface, and the 1-2 surface and the 2-2 surface face each other.

* * * * *